United States Patent [19]
Allen

[11] Patent Number: 6,010,345
[45] Date of Patent: Jan. 4, 2000

[54] LEVERAGED APPARATUS FOR SELECTIVELY DECOUPLING EITHER OF TWO PERPENDICULARLY COUPLED CIRCUIT BOARDS FROM THE OTHER CIRCUIT BOARD

[75] Inventor: Joseph R. Allen, Tomball, Tex.

[73] Assignee: Compaq Computer Corporation, Houston, Tex.

[21] Appl. No.: 08/910,954

[22] Filed: Aug. 8, 1997

[51] Int. Cl.[7] .................................................. H01R 13/62
[52] U.S. Cl. ............................................................ 439/159
[58] Field of Search .................................. 439/159, 160, 439/157, 152, 476.1, 64

[56] References Cited

U.S. PATENT DOCUMENTS 4,840,570   6/1989   Mann, Jr. et al. ......................... 439/74
5,848,906   12/1998  Glusker et al. ........................... 439/157

*Primary Examiner*—Paula Bradley
*Assistant Examiner*—Tho Dac Ta
*Attorney, Agent, or Firm*—Konneker & Smith, P.C.

[57] ABSTRACT

In a computer server orthogonally coupled processor and expansion circuit boards are respectively supported on corresponding vertical and horizontal chassis walls of the server. Upper and lower leveraged disconnect structures are respectively associated with the expansion and processor boards and are operative to disconnect either circuit board from the other circuit board without (1) disturbing the other circuit board, (2) using tools of any sort, or (3) damaging the mating circuit board connectors. The lower leveraged disconnect structure is also operative to recouple the disconnected processor circuit board to the undisturbed expansion circuit board.

35 Claims, 6 Drawing Sheets

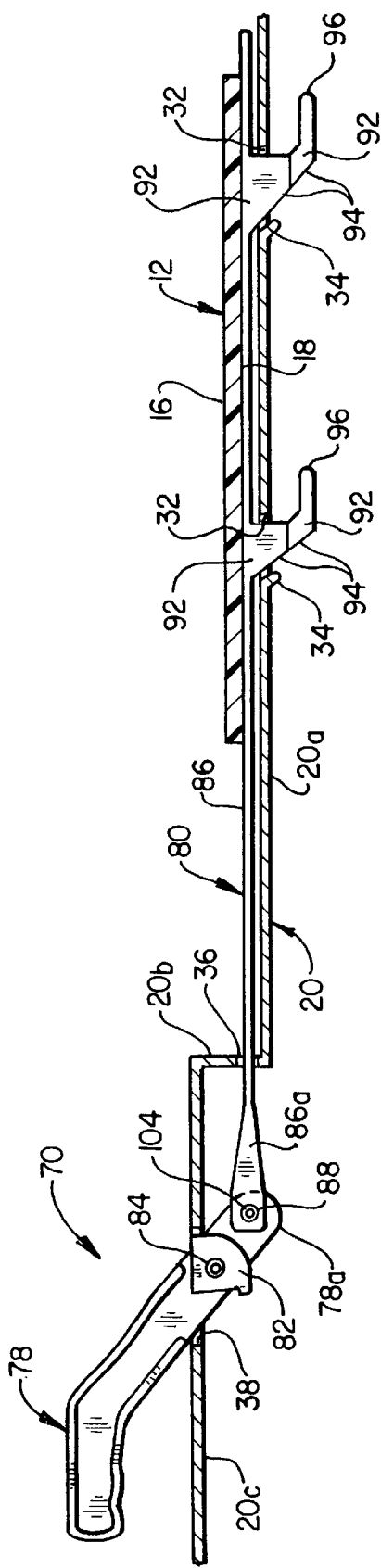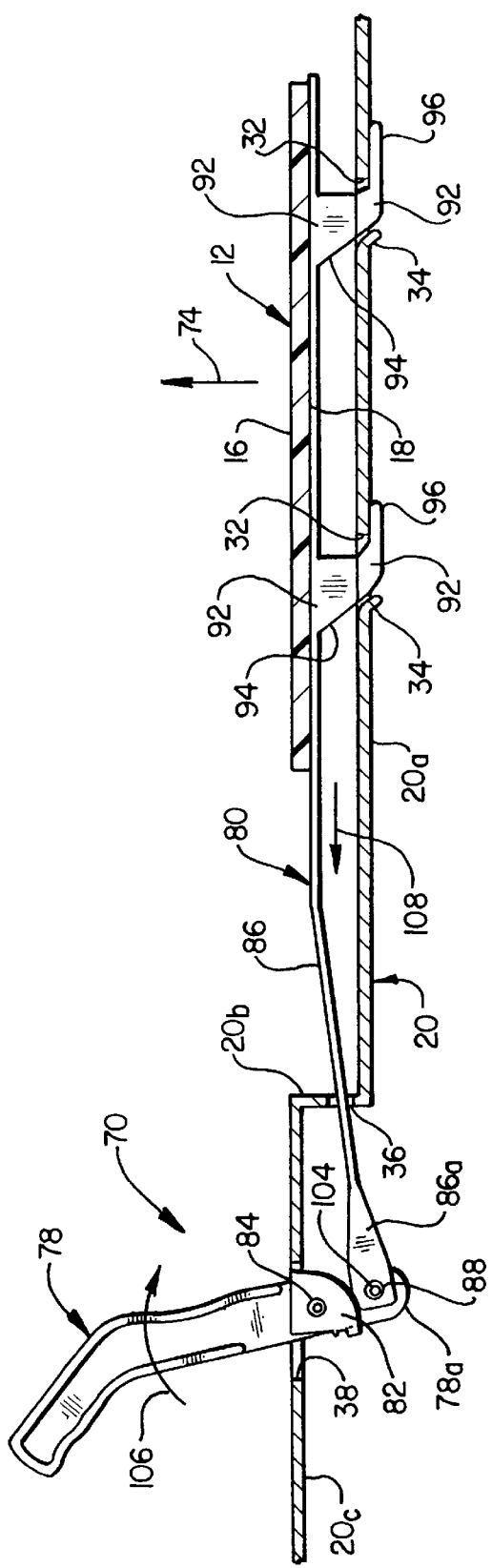

LEVERAGED APPARATUS FOR SELECTIVELY DECOUPLING EITHER OF TWO PERPENDICULARLY COUPLED CIRCUIT BOARDS FROM THE OTHER CIRCUIT BOARD

BACKGROUND OF THE INVENTION

1. Field of the Invention

The present invention generally relates to electronic apparatus and, in a preferred embodiment thereof, more particularly relates to the coupling and decoupling of transversely oriented circuit boards used in electronic apparatus such as computers.

2. Description of Related Art

For a variety of reasons, such as maintaining a reduced bus length and physical form factor, when two printed circuit boards are to be operatively coupled to one another using mating connectors thereon it is often desirable to position the coupled circuit boards in a mutually perpendicular relationship. A representative application of this orthogonal circuit board connection technique is the coupling of a processor board and its related expansion board in a computer server. The expansion board is mounted on a first chassis wall of the server, while the processor board is mounted on a transverse second chassis wall with connectors on the two perpendicular circuit boards being removably coupled to one another. Various problems are typically presented by this circuit board arrangement.

One problem associated with this orthogonal circuit board configuration as previously utilized is that neither circuit board can be removed from the system without disturbing or disconnecting the other circuit board. Another problem is that the separation of the two circuit boards is often a tedious, time consuming process that typically requires the skilled and patient use of various tools.

Yet another problem is that during disconnection of the two boards it is necessary to maintain them in a precisely perpendicular relationship to avoid damaging one or both of their mated connectors. This requirement is particularly critical in high density connectors typically associated with high speed circuit boards. It is also often a difficult requirement to meet due to the difficulty of manually manipulating the two circuit boards in a confined chassis area.

As can be seen from the foregoing, because of these problems a need exists for an improved technique for separating orthogonally connected circuit boards. It is to these problems that the present invention is directed.

SUMMARY OF THE INVENTION

In carrying out principles of the present invention, in accordance with a preferred embodiment thereof, electronic apparatus is provided which is representatively in the form of a computer server and includes first and second orthogonally oriented circuit boards carried on a support structure, illustratively transverse chassis walls of the server, and being releasably coupled by first and second connectors respectively carried by the first and second circuit boards. The first and second connectors are disconnectable by moving either one of the first and second circuit boards away from the other circuit board in a first direction transverse to the first circuit board and parallel to the second circuit board.

To enable either circuit board to be disconnected from the other circuit board without (1) the use of tools, (2) disturbing the other circuit board, or (3) damaging either connector, first and second specially designed disconnect structures are provided.

The first disconnect structure is operative to move the first circuit board away from the second circuit board in the first direction in a manner disconnecting the first connector from the second connector without disturbing the second circuit board, and the second disconnect structure is operative to move the second circuit board away from the first circuit board in the first direction in a manner disconnecting the second connector from the first connector without disturbing the first circuit board. Preferably, the second disconnect structure is further operative to move the second circuit board toward the first circuit board in the first direction in a manner connecting the second connector to the first connector.

In a preferred embodiment thereof, the first disconnect member includes a disconnect member interposed between the first circuit board and the support structure and movable relative thereto in a second direction perpendicular to the first direction. Cooperating structures on the disconnect member and the support structure are operative to cause the disconnect member to forcibly move the first circuit board away from the second circuit board in the first direction, in a manner disconnecting the first connector from the second connector, in response to movement of the disconnect member in the second direction relative to the first circuit board and the support structure.

Representatively, a lever handle is pivotally connected to the support structure and to the disconnect member, and is manually operative to exert a leveraged force on the disconnect member in the second direction, and the cooperating structures are cooperating cam surfaces on the disconnect member and the support structure. Illustratively, these cam surfaces are formed on tab projections formed on the disconnect member and extending through openings in the support structure, and on facing tab projections formed on the support structures at the peripheries of the openings formed therein. The disconnect member has an opening through which the first connector extends, and has contact projections which slidingly engage component-free side surface portions of the first circuit board.

In a preferred embodiment thereof, the second disconnect structure includes a lever member coupled to the second circuit board and the support structure and rotatable relative to the support structure, in a first rotational direction about an axis transverse to the first direction and parallel to the plane of the second circuit board, to forcibly move the second circuit board away from the first circuit board in the first direction in a manner disconnecting the second connector from the first connector. Preferably, the lever member is rotatable in a second rotational direction, opposite to the first rotational direction, to forcibly move the second circuit board toward the first connector in the first direction in a manner connecting the second connector to the first connector.

According to other aspects of the invention, the second circuit board is supported on and parallel to a subpan member, and the lever member is pivotally connected to a bracket structure carried on the subpan member. The lever member is in a first pivoted position when the first and second connectors are coupled, and is in a second pivoted position when the first and second connectors are decoupled. The lever member has a portion releasably latchable to the bracket structure to releasably retain the lever member in its first pivoted position.

Preferably, a slot is formed in the support structure and extends parallel to the first direction, and a tab structure is formed on the subpan member and is slidingly received in the slot to maintain movement of the subpan member, and thus the second circuit board, parallel to the first direction.

According to another feature of the invention, the support structure has an opening formed therein and disposed between first and second abutment tabs on the support structure, and the lever member has an end portion extending through the opening and movably into abutment with the first and second tabs in response to rotation of the lever member in opposite directions about its pivot axis.

BRIEF DESCRIPTION OF THE DRAWINGS

FIGS. 6 and 6A are simplified enlarged scale cross-sectional views taken through the upper circuit board and its associated leveraged disconnect structure along line 6—6 of FIG. 1 and sequentially illustrate the disconnection of the upper circuit board from the lower circuit board.

DETAILED DESCRIPTION

Figure 1:
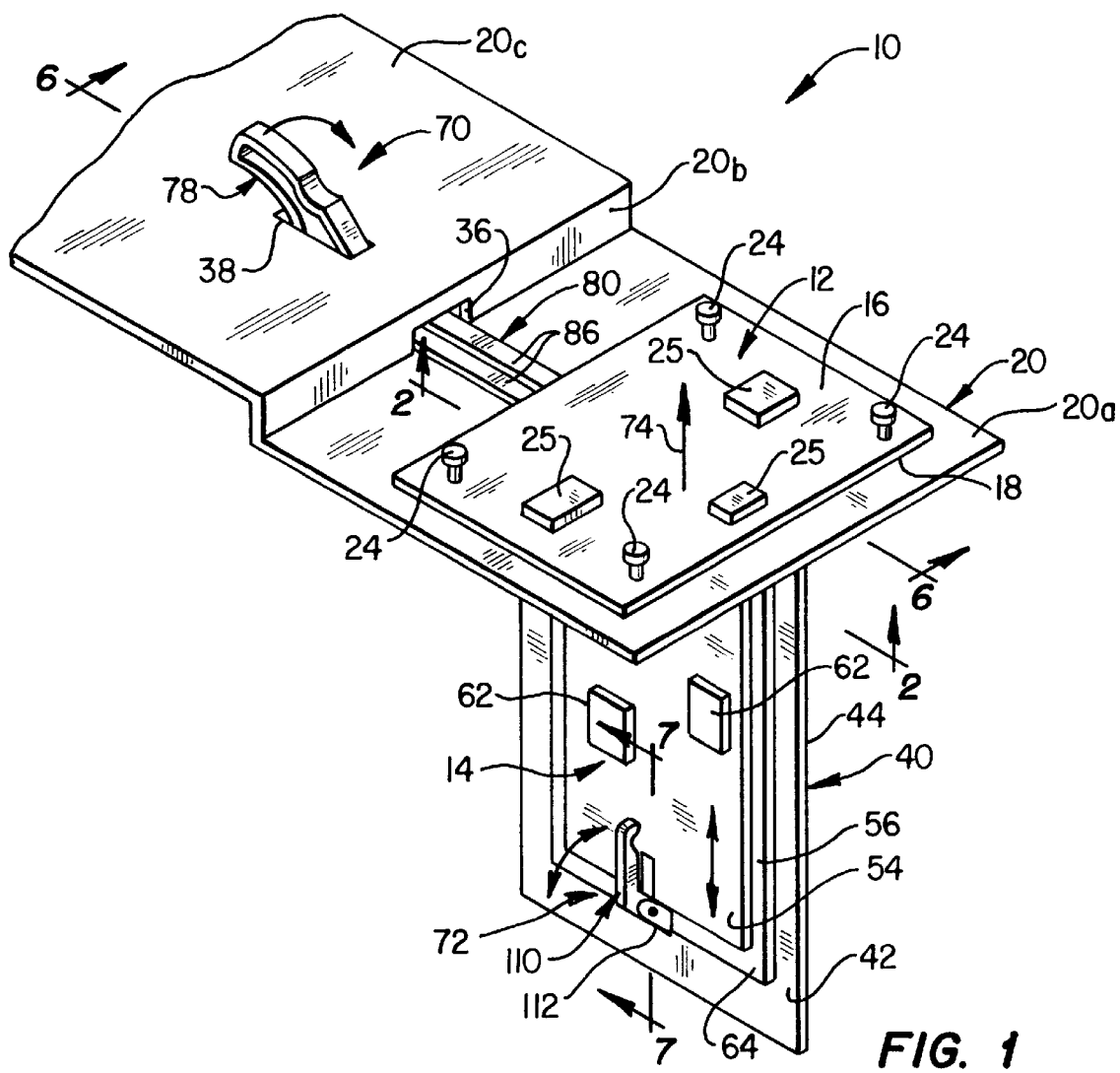
FIG. 1 is a simplified perspective view of first and second perpendicularly coupled circuit boards, each of which may be decoupled from the other circuit board, without disturbing or disconnecting it, using specially designed leveraged decoupling apparatus embodying principles of the present invention.

Perspectively illustrated in FIG. 1 is a portion of an electronic apparatus, representatively a computer server 10, in which first and second circuit boards 12 and 14 are removably connected to one another in a mutually perpendicular relationship. Illustratively, the circuit board 12 is in a horizontal orientation and is an expansion board, while the circuit board 14 is in a vertical orientation and is a processor board. As will be readily appreciated, these two perpendicular circuit boards could be other types of circuit boards, and could be operatively incorporated in a variety of electronic devices other than a computer server.

Figure 2:
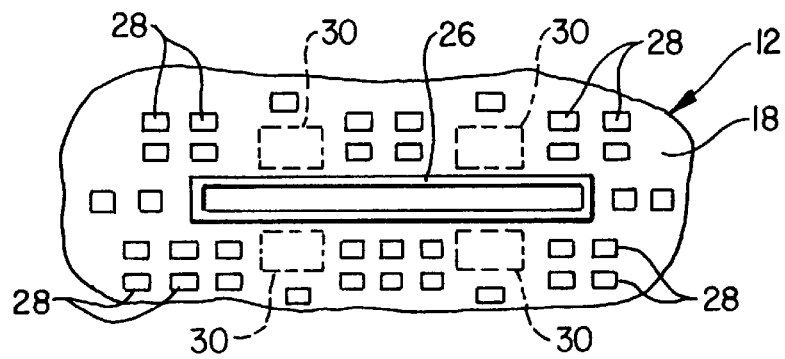
FIG. 2 is a simplified, enlarged scale, bottom plan view of a portion of the upper circuit board taken along line 2—2 of FIG. 1.
Figure 3:
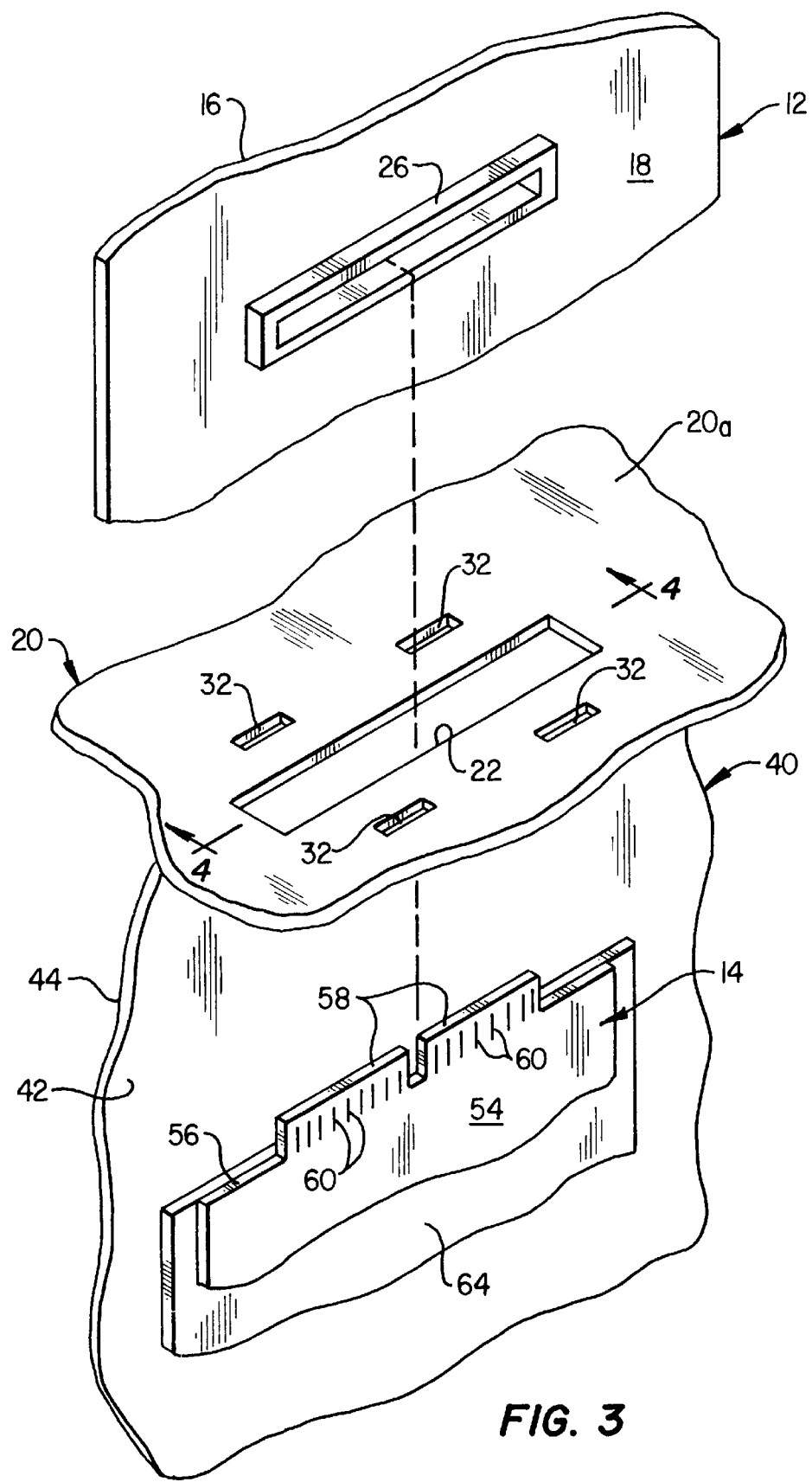
FIG. 3 is an enlarged scale, simplified, partially exploded view of portions of the two circuit boards and the perpendicular chassis walls on which they are supported.
Figure 4:
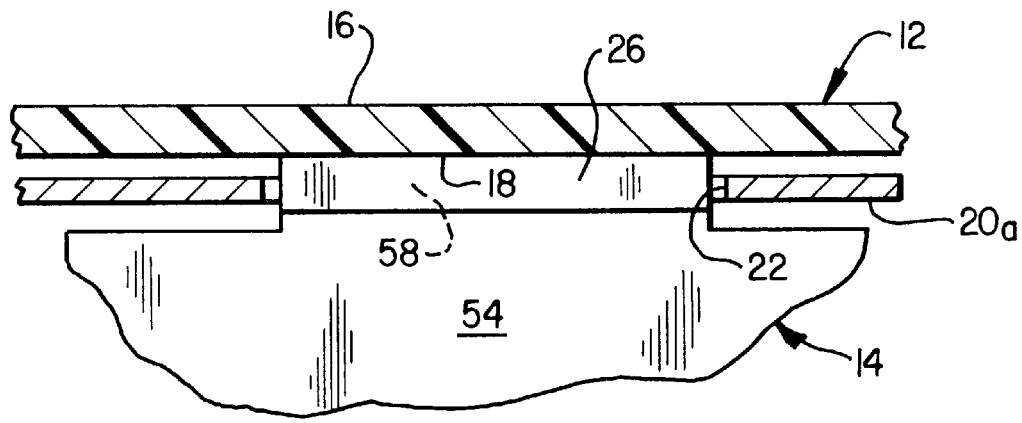
FIGS. 4–4B are enlarged scale cross-sectional views through the upper chassis wall, taken along line 4—4 of FIG. 3, and respectively illustrate the two circuit boards in their connected state, the upper circuit board upwardly removed from the undisturbed lower circuit board, and the lower circuit board downwardly removed from the undisturbed upper circuit board.
Figure 4A:
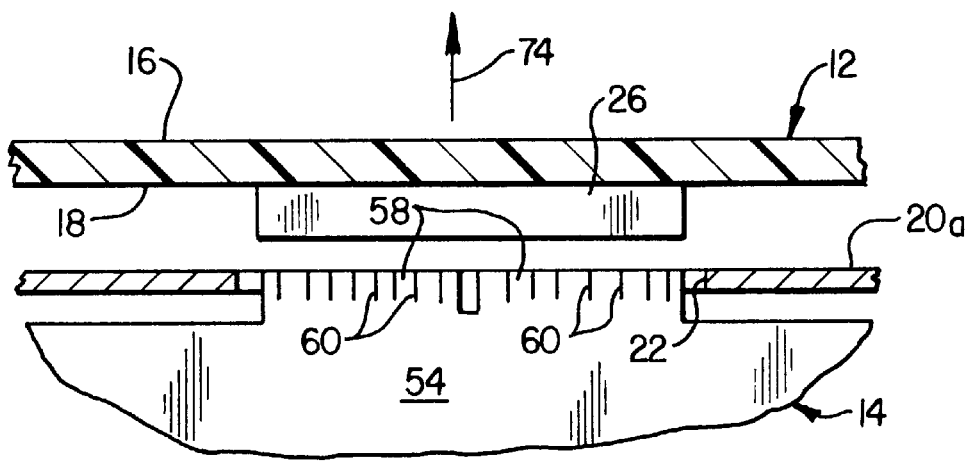
Figure 4B:
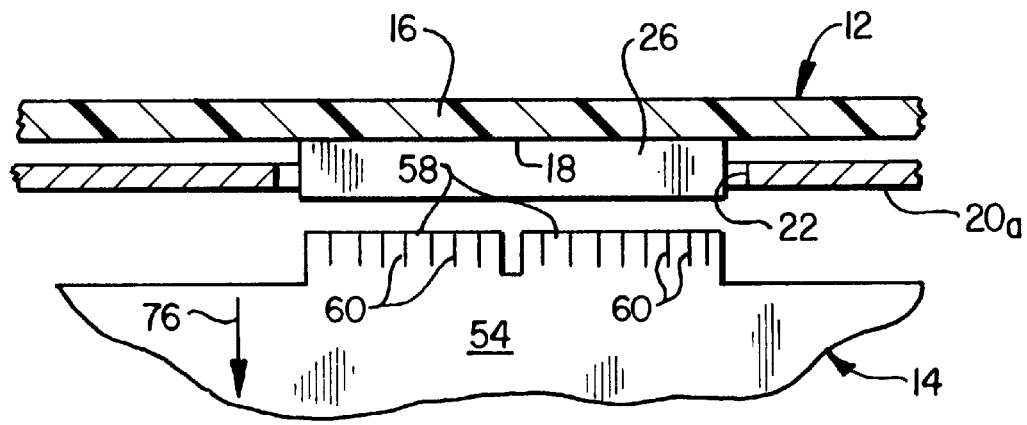

Circuit board 12 has upper and lower sides 16 and 18 and is removably secured atop a right portion 20a of a horizontal chassis wall 20 over an elongated rectangular opening 22 therein (see FIGS. 3–4B). As illustrated in FIG. 1, the circuit board 12 is removably secured to the chassis wall portion 20a by means of a series of conventional push-pull connectors 24. Various electronic components 25, only a few of which are shown in FIG. 1, are mounted on the upper side 16 of the upper circuit board 12. Mounted on the lower side 18 of the upper circuit board 12 (see FIGS. 2–4B) is an elongated socket type connector 26 which is downwardly extendable through the chassis wall opening 22.

As can be best seen in FIG. 2, a series of electronic components 28 are mounted on the lower side 18 of the upper circuit board 12 around the connector 26. For purposes later described herein, two longitudinally spaced apart dashed line areas 30 on each side of the connector 26 are kept free of components. Also for purposes later described herein, a longitudinally spaced apart pair of small rectangular openings 32 (see FIGS. 3, 6 and 6A) are formed through the chassis wall portion 20a on each side of the opening 22. At the left end of each of these openings 32 (see FIGS. 6 and 6A) is a downwardly and rightwardly sloped tab section 34 of the wall portion 20a.

The upper chassis wall portion 20a, atop which the upper circuit board 12 is mounted, extends rightwardly from an upwardly projecting wall portion 20b that in turn is connected to an elevated left wall portion 20c as illustrated in FIGS. 1, 6 and 6A. A rectangular opening 36 is formed in the upwardly projecting wall portion 20b, and a rectangular opening 38 is formed in the horizontally extending left wall portion 20c.

Downwardly extending transversely from the upper chassis wall 20 is a lower chassis wall 40, portions of which are illustrated in FIGS. 1, 3, 7 and 7A. Lower chassis wall 40 has opposite front and rear sides 42 and 44, a vertically elongated rectangular opening 46 (see FIGS. 7 and 7A), and a rectangular opening 48 spaced downwardly apart from the opening 46 and having rearwardly projecting tabs 50 and 52 along its upper and lower sides (see FIGS. 7 and 7A). The lower chassis wall 40 is positioned slightly rearwardly of the connector opening 22 in the upper chassis wall 20 (see FIG. 3).

The lower circuit board 14 has front and rear sides 54,56 (see FIGS. 1, 3–4B, 7 and 7A), and a top side edge connector portion 58, with goldfingers 60 thereon, which is releasably insertable into the socket connector portion 26 of the upper circuit board 12 to operatively couple the circuit boards 12 and 14. Various electronic components, such as the components 62 schematically illustrated in FIG. 1, are mounted on the vertically oriented front side 54 of the lower circuit board 14.

Figure 7A:
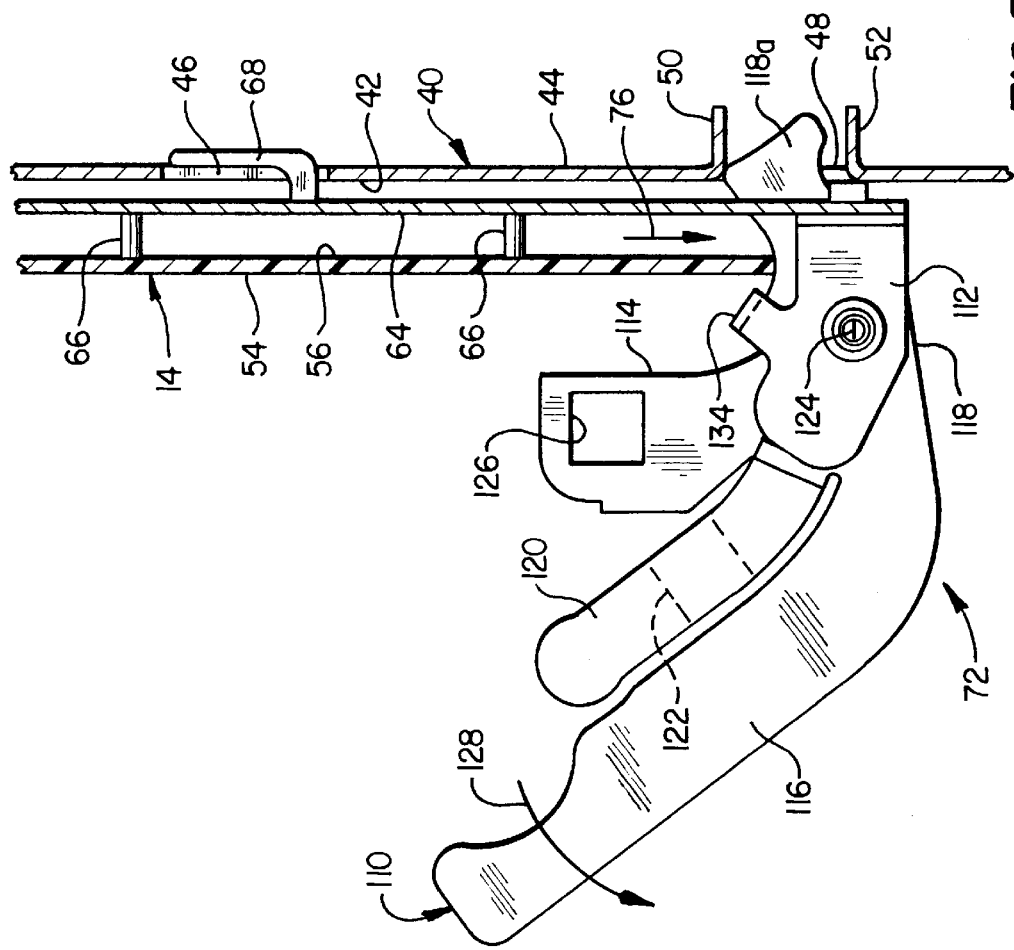
FIGS. 7 and 7A are simplified enlarged scale cross-sectional views taken through the lower circuit board and its associated leveraged disconnect structure along line 7—7 of FIG. 1 and sequentially illustrate the disconnection of the lower circuit board from the upper circuit board.
Figure 7:
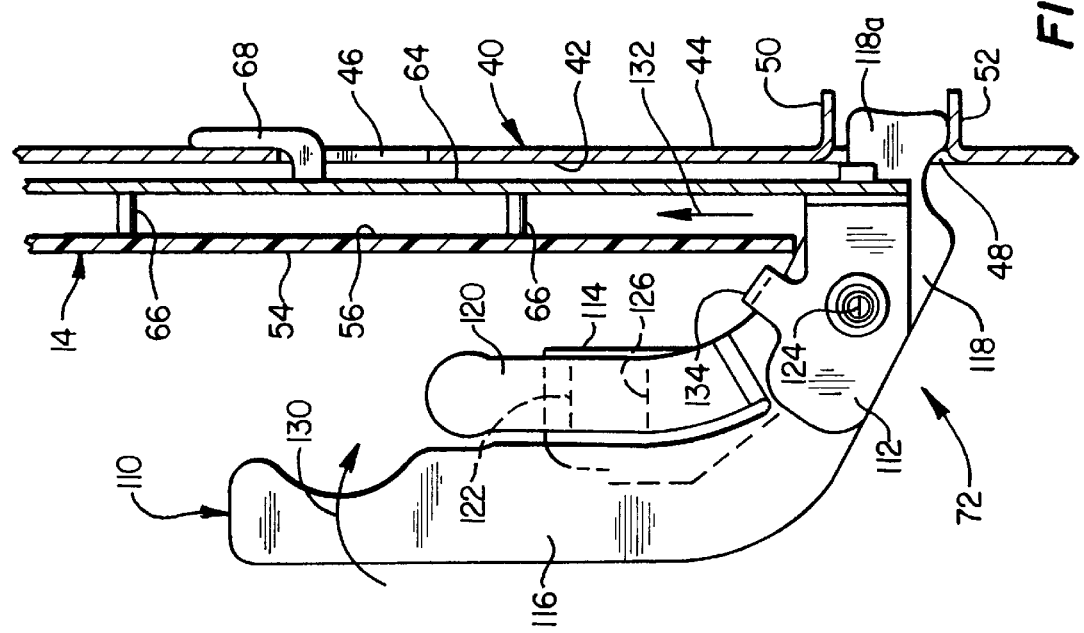

As best illustrated in FIGS. 7 and 7A, the lower circuit board 14 is anchored to a sheet metal support subpan 64, in a parallel, forwardly spaced relationship therewith, by suitable support structures 66 shown in FIGS. 7 and 7A. Subpan 64, in turn, is slidingly supported on the front side 42 of the lower chassis wall 40 for vertical movement relative thereto toward and away from the upper chassis wall portion 20a. The subpan 64, and thus the lower circuit board 14, is restrained against appreciable horizontal movement relative to the lower chassis wall 40 by means of a generally L-shaped tab 68 (see FIGS. 7 and 7A) formed on the rear side of the subpan 64 and slidingly received in the opening 46 in the lower chassis wall 40.

Referring now to FIGS. 1 and 4–4B, in accordance with a key aspect of the present invention, either of the two orthogonally coupled circuit boards 12 and 14 may be uncoupled from the other circuit board (1) without the use of tools, (2) without disturbing the other circuit board, and (3) without damaging either of the coupled circuit board connectors 26 and 58. This desirable disconnect function, as later described herein, is achieved using a specially designed leveraged extractor mechanism 70 associated with the upper circuit board 12, and a specially designed leveraged insert/eject mechanism 72 associated with the lower circuit board 14.

In FIG. 4, the upper and lower circuit boards 12 and 14 are schematically depicted as being operatively coupled, with the edge connector structure 58 of the lower circuit board 14 being upwardly and removably received within the socket connector structure 26 of the upper circuit board 12. In a manner subsequently described herein, when it is desired to remove the upper circuit board 12 for service, inspection, replacement or upgrading, the upper extractor mechanism 70 is operated to forcibly move the upper circuit board 12 upwardly away from the lower circuit board 14 (as indicated by the arrow 74 in FIG. 4A) in a direction precisely parallel to the proper connector-to-connector insertion and removal direction and in a manner uncoupling the upper connector 26 from the lower connector 58 without disturbing the lower circuit board 14. Prior to this removal of the upper circuit board 12 it is, of course, necessary to loosen its push-pull connectors 24 and disconnect any cabling connected to the upper circuit board, and any other board-connected structure blocking such removal.

In a manner also subsequently described herein, when it is desired to remove the lower circuit board 14 for service, inspection, replacement or upgrading the lower insert/eject mechanism 72 is operated to forcibly move the lower circuit board 14 (and the subpan 64) downwardly away from the upper circuit board 12 (as indicated by the arrow 76 in FIG. 4B) in a direction precisely parallel to the proper connector-to-connector insertion and removal direction and in a manner uncoupling the lower connector 58 from the upper connector 26 without disturbing the upper circuit board 12. Prior to this removal of the lower circuit board 14 it is necessary to disconnect any cabling connected to the lower circuit board, and any other board-connected structure blocking such removal. After this disconnection of the lower circuit board 14 has been effected, the lower insert/eject mechanism 72 may be used in a later described manner to forcibly reconnect the lower circuit board connector 58 to the undisturbed upper circuit board connector 26.

Turning now to FIGS. 1, 5, 6 and 6A, the leveraged upper extractor mechanism 70 includes two primary components—an elongated plastic lever handle 78 and an elongated rectangular sheet metal disconnect member 80. The lever handle 78 extends downwardly through the opening 38 in the upper chassis wall portion 20c and has a lower end portion pivotally connected to a bracket structure 82, projecting downwardly from the wall portion 20c, by a suitable fastener 84 (see FIGS. 6 and 6A).

Figure 5:
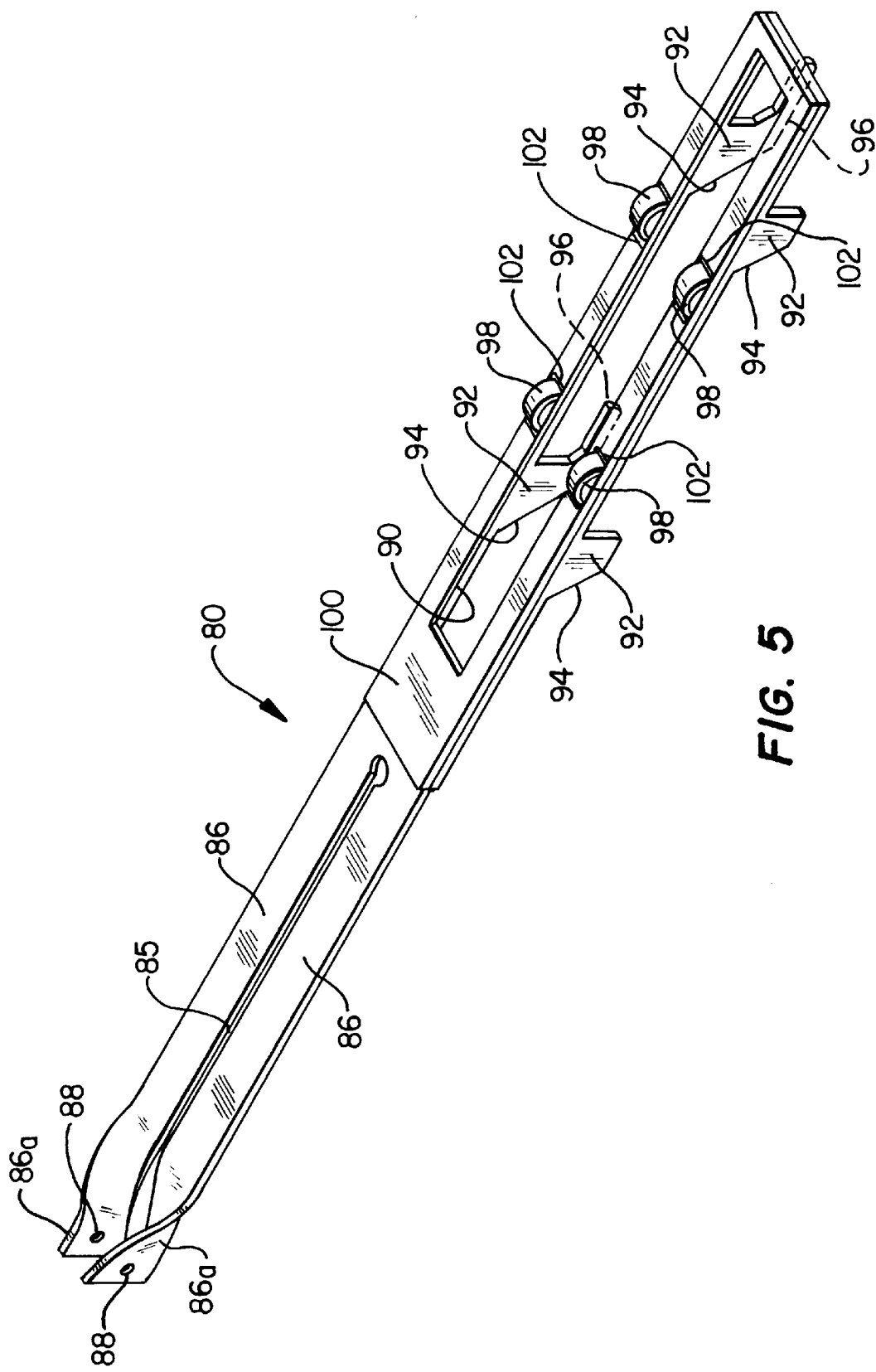
FIG. 5 is an enlarged scale perspective view of a specially designed disconnect member used to decouple the upper circuit board from the lower circuit board.

As best illustrated in FIG. 5, a rear or left longitudinal portion of the disconnect member 80 is split, as at 85, to form two side-by-side leg portions 86 having outer end portions 86a which are twisted 90 degrees into vertical planes and have connection openings 88 formed therein. Forwardly of the leg portions 86 the body of the disconnect member 80 has an elongated rectangular opening 90 which is sized to downwardly and movably receive the socket connector 26 of the upper circuit board 12 as later described herein. The length of the opening 90 is somewhat longer than the length of the socket connector 26.

Extending downwardly from adjacent each elongated side of the opening 90 are a longitudinally spaced pair of cam tabs 92 which have rearwardly and upwardly sloped rear side edges 94. For purposes later described herein, each of the pair of tabs 92 on one side of the opening 90 extend lower than the tabs 92 on the other side of the opening 90 and have forwardly projecting retaining finger portions 96 on their lower sides. Longitudinally spaced pairs of smooth, upwardly projecting arcuate contact projections 98 are formed on the disconnect member body on opposite sides of the opening 90 between the longitudinally spaced pairs of tabs 92 as illustrated in FIG. 5. A thin sheet 100 of a dielectric material, such as plastic, is suitably secured to a top front side portion of the disconnect member body (see FIG. 5), with the arcuate contact projections 98 extending upwardly through suitably openings 102 formed in the dielectric sheet 100.

Still referring to FIGS. 1, 5, 6 and 6A, in the assembled structure shown in FIG. 1, the disconnect member 80 longitudinally extends through the opening 36 in the upper chassis wall portion 20b, with the disconnect member end tabs 86a (see FIG. 6) straddling the inner end 78a of the upper lever handle 78 and being pivotally secured to by a suitable fastener 104 extending through the lever end 78a and the tab holes 88. The front longitudinal portion of the disconnect member 80 in which the elongated rectangular opening 90 is formed (see FIG. 5) underlies the upper circuit board 12, with the arcuate contact projections 98 of the disconnect member 80 (see FIG. 5) slidingly engaging the component-free dashed line areas 30 on the lower side 18 of the upper circuit board 12.

The cam tab portions 92 of the disconnect member 80 extend downwardly through the small rectangular openings 32 in the upper chassis wall portion 20a (see FIG. 3), and the bottom side of the disconnect member 80 is closely adjacent the top side of the chassis wall portion 20a. The upper lever handle 78 is in its FIG. 6 position, and the upper circuit board socket type connector 26 extends downwardly through the connector member opening 90 (see FIG. 5) and is operatively coupled to the lower circuit board connector 58 as schematically indicated in FIG. 4. The engagement of the arcuate disconnect member contact projections 98 (see FIG. 5) with the component-free underside areas 30 of the upper circuit board 12 (see FIG. 2) provides clearance between the components 28 and the underlying front longitudinal portion of the disconnect member 80, and the plastic sheet 100 (see FIG. 5) electrically isolates the components 28 from the sheet metal disconnect member 80.

To disconnect the upper circuit board 12 from the lower circuit board 14 without using tools, disturbing the lower circuit board 14, or damaging either of the mated connectors 26 and 58, the upper circuit board push-pull connectors 24 are uncoupled, and the circuit board is uncabled from adjacent components and otherwise freed for removal from the lower circuit board 14.

The upper lever handle 78 is then simply manually pivoted in a clockwise direction from its FIG. 6 position to its FIG. 6A position as indicated by the arrow 106 in FIG. 6A. This pivoting of the lever handle 78 forcibly shifts the disconnect member 80 in a leftward direction relative to the upper circuit board 12 and the chassis wall 20 as indicated by the arrow 108 in FIG. 6A. In turn, this leftward translational shifting of the disconnect member 80 causes a camming engagement between the sloped rear side edges of its tabs 92 and the facing downwardly projecting cam tabs 34 on the underside of the upper chassis wall portion 20a as illustrated in FIGS. 6 and 6A.

As can be seen by comparing FIGS. 6 and 6A, this camming action between the tabs 92 and 34 forces a right longitudinal portion of the disconnect member 80 upwardly relative to the chassis wall portion 20a, thereby also upwardly moving the circuit board 12, as indicated by the arrow 74 in FIG. 6A, and disconnecting the upper connector 26 from the undisturbed lower connector 58 as schematically shown in FIG. 4A. During this horizontal and vertically cammed movement of the disconnect member 80 its contact projections 98 (see FIG. 5) slid across the component-free areas 30 on the underside of the upper circuit board 12 (see FIG. 2) without contacting or damaging any of the schematically depicted components 28 on the underside of the circuit board 12.

At the same time, the contact projections 98 were exerting vertical connector decoupling forces on the upper circuit board 12 which were symmetrically disposed on opposite sides of the upper connector 26. Thus, there was no appreciable tendency of the connector 26 to be undesirably "tilted" relative to its underlying mating connector 58 during connector decoupling in a manner potentially causing damage to one or both of the connectors 26 and 58. As can be seen in simplified form in FIG. 6A, at the end of the upward decoupling stroke of the disconnect member 80, the tab fingers 96 thereon are moved upwardly into engagement with the underside of the chassis wall portion 20a to thereby prevent further upward movement of the disconnect member 80 and undesired separation from the chassis wall portion 20a.

After the upper circuit board 12 has been removed and, for example, repaired it may be rapidly and easily replaced and recoupled to the lower circuit board 14 by pivoting the upper lever handle 78 from its FIG. 6A position to its original FIG. 6 position, and manually inserting the upper circuit board connector 26 downwardly through the disconnect member opening 90 (see FIG. 5) and the underlying chassis wall opening 22 (see FIG. 3) and pushing down on the circuit board 12 to recouple the circuit board connectors 26 and 58 as schematically depicted in FIG. 4.

Turning now to FIGS. 1, 7 and 7A, the lower leveraged insert/eject mechanism 72 includes an elongated plastic lever handle 110, and first and second metal bracket plate members 112 and 114.

The lower lever handle 110 has angled outer and inner longitudinal portions 116 and 118, and an elongated, resiliently deflectable latching portion 120 which extends generally parallel to the outer longitudinal portion 116 and has a rectangular detent projection 122 on one of its sides. The bracket plates 112,114 are transversely secured, in a spaced apart parallel relationship, to a lower outer side surface of the subpan 64, with the inner longitudinal portion of the lever handle 110 extending between the two bracket plates.

As illustrated in FIGS. 7 and 7A, a suitable connection member 124 extends through the bracket plates 112,114 and the lever handle portion therebetween to mount the lever handle 110 for pivotal movement relative to the lower chassis wall 40 about an axis parallel to the plane of the lower circuit board 14 and transverse to the connection/disconnection direction of the mated circuit board connectors 26 and 58. With the lower lever handle 110 pivotally mounted in this manner on the subpan 64 in this manner, the free end 118a of the lever portion 118 is received in the lower chassis wall opening 48 between its upper and lower transverse tabs 50 and 52.

With the lower lever handle 110, the lower circuit board 14 and the subpan 64 in their FIG. 7 positions, the lower circuit board connector 58 is operatively coupled to the upper circuit board connector 26 as schematically shown in FIG. 4, the free lever handle end 118a downwardly engages the lower chassis wall tab 52, and the lever handle detent projection 122 is complementarily received in a corresponding rectangular opening 126 in the bracket plate 114 in a manner releasably locking the lever handle 110 against counterclockwise rotation away from its FIG. 7 position.

To disconnect the lower circuit board 14 from the upper circuit board 12 without using tools, disturbing the upper circuit board 12, or damaging either of the mated connectors 26 and 58, the lower circuit board 14 is first uncabled from adjacent components and otherwise freed for removal from the upper circuit board 12. The latching portion 120 of the lever handle 110 is then transversely deflected relative to the handle portion 116 to remove the detent projection 122 from its corresponding bracket plate opening 126, and the lever handle 110 is manually pivoted in a counterclockwise direction relative to the subpan 64 and lower circuit board 14 as indicated by the arrow 128 in FIG. 7A.

This counterclockwise rotation of the lever handle 110 causes its free end 118a to engage the upper chassis wall tab 50 to thereby cause the lever handle 110 to exert a leveraged downward force on the subpan 64 and thus on the lower circuit board 14. Such leveraged force causes the subpan 64 and lower circuit board 14 to be driven downwardly relative to the lower chassis wall 40, as indicated by the arrow 76 in FIG. 7A, thereby disconnecting the lower circuit board connector 58 from the undisturbed upper circuit board connector 26 as schematically depicted in FIG. 4B. The sliding engagement of the subpan tab 68 with the corresponding chassis wall slot 46 maintains this subpan and circuit board movement precisely parallel to the proper connector coupling/uncoupling direction to avoid damage to either of the connectors 26,58.

After the lower circuit board 14 has been disconnected from the undisturbed upper circuit board 12 in this manner the disconnected circuit board 14 and its associated subpan structure 64 may simply be pulled leftwardly away from the lower chassis wall 40. To replace the removed circuit board 14 (or a substitute circuit board as the case may be) on the chassis wall 40, the circuit board 14 is simply repositioned in its FIG. 7A orientation with the lever handle 110 also in its FIG. 7A orientation.

The lever handle 110 is then pivoted in a clockwise direction back to its FIG. 7 orientation as indicated by the arrow 130 in FIG. 7. This causes the free lever handle end 118a to engage the lower chassis wall tab 52, thereby also causing the lever handle 110 to exert a leveraged upward force on the subpan 64 and lower circuit board 14. In turn, the subpan 64 and lower circuit board 14 are driven upwardly, as indicated by the arrow 132 in FIG. 7, to thereby operatively recouple the circuit board connectors 26,58 as schematically depicted in FIG. 4. The cooperation between the subpan tab 68 and the chassis wall slot 46 assures that this upward circuit board movement is precisely parallel to the proper connector coupling and uncoupling direction, and that the lower circuit board connector 58 remains in proper horizontal alignment with the upper circuit board connector 26.

When the lever handle 110 is pivotally returned to its FIG. 7 position, a stop flange 134 on the bracket plate 112 acts as a handle abutment to prevent further clockwise rotation of the lever handle 110, and the detent projection 122 resiliently snaps back into the bracket plate opening 126 to prevent unintentional counterclockwise pivotal movement of the lower handle 110.

The foregoing detailed description is to be clearly understood as being given by way of illustration and example only, the spirit and scope of the present invention being limited solely by the appended claims.

What is claimed is:

1. Electronic apparatus comprising:
   a support member having a side surface;
   a circuit board having a side surface with a first connector thereon, said side surface of said circuit board facing said side surface of said support member;

a second connector coupled to said first connector,
  said first connector being disconnectable from said second connector by moving said circuit board away from said side surface of said support member in a first direction perpendicular to said side surface of said circuit board;
a disconnect member interposed between said side surface of said circuit board and said side surface of said support member and movable relative thereto in a second direction perpendicular to said first direction; and
cooperating structures on said disconnect member and said support member operative to cause said disconnect member to forcibly move said circuit board in said first direction, in a manner disconnecting said first connector from said second connector, in response to movement of said disconnect member in said second direction relative to said support member and said circuit board.

2. The electronic apparatus of claim 1 wherein said electronic apparatus is a computer server.

3. The electronic apparatus of claim 1 further comprising a lever handle operative to exert a leveraged force in said second direction on said disconnect member.

4. The electronic apparatus of claim 3 wherein said lever handle has a first portion pivotally connected to said support member, and a second portion pivotally connected to said disconnect member.

5. The electronic apparatus of claim 1 wherein said cooperating structures include cooperating cam surfaces on said disconnect member and said support member.

6. The electronic apparatus of claim 5 wherein:
  said support member is a wall structure having a spaced plurality of openings therein,
  said disconnect member has a spaced plurality of tab portions formed thereon and extending through said spaced plurality of openings, and
  said cooperating cam surfaces include first cam surfaces carried by said tab portions and second cam surfaces carried by said wall structure.

7. The electronic apparatus of claim 6 wherein;
  said first cam surfaces are defined by sloping edge portions of said tab portions, and
  said second cam surfaces are disposed on sloping cam tab portions formed on said wall structure adjacent said spaced plurality of openings and facing said sloping edge portions of said tab portions of said disconnect member.

8. The electronic apparatus of claim 7 wherein at least one of said tab portions of said disconnect member is configured to impede withdrawal thereof from its associated support member opening.

9. The electronic apparatus of claim 8 wherein said at least one of said tab portions of said disconnect member has an elongated outer side edge portion positioned on a side of said support member opposite from said side surface of said support member, said elongated outer side edge portion longitudinally extending generally parallel to said side surface of said support member.

10. The electronic apparatus of claim 1 wherein:
  said side surface of said circuit board has component-free areas positioned on opposite sides of said first connector,
  said disconnect member has a surface portion facing said side surface of said circuit board, and
  said disconnect member has a plurality of contact projections disposed on and extending outwardly from said surface portion, said contact projections slidingly engaging said component-free areas.

11. The electronic apparatus of claim 10 wherein:
  said contact projections have, relative to said side surface of said circuit board, convexly curved configurations.

12. The electronic apparatus of claim 10 further comprising a sheet of dielectric material disposed on said surface portion of said disconnect member.

13. Electronic apparatus comprising:
a support member having a side surface;
a circuit board having an edge portion with a first connector thereon, said circuit board being supported in a parallel relationship with said side surface for movement in a first direction parallel thereto;
a second connector coupled to said first connector,
  said first connector being disconnectable from said second connector by moving said circuit board away from said second connector in said first direction; and
a lever member coupled to said circuit board and said support member and rotatable relative to said support member, in a first rotational direction about an axis transverse to said first direction and parallel to said support member side surface, to forcibly move said circuit board away from said second connector in said first direction in a manner disconnecting said first connector from said second connector,
  said support member having an opening formed therein and disposed between first and second abutment tabs on said support member, and
  said lever member having an end portion extending through said opening and movable into abutment with said first and second tabs in response to rotation of said lever member in opposite directions about said axis.

14. The electronic apparatus of claim 13 wherein said electronic apparatus is a computer server.

15. The electronic apparatus of claim 13 wherein said lever member is rotatable in a second rotational direction, opposite to said first rotational direction, to forcibly move said circuit board toward said second connector in said first direction in a manner connecting said first connector to said second connector.

16. The electronic apparatus of claim 13 wherein said circuit board is supported on and parallel to a subpan member, and said lever member is pivotally connected to said subpan member.

17. The electronic apparatus of claim 16 wherein said lever member is pivotally connected to a bracket structure carried on said subpan member.

18. The electronic apparatus of claim 17 wherein:
  said lever member is in a first pivoted position when said first and second connectors are coupled, and in a second pivoted position when said first and second connectors are decoupled, and
  said lever member has a portion releasably latchable to said bracket structure to releasably retain said lever member in said first pivoted position thereof.

19. Electronic apparatus comprising:
a support member having a side surface;
a circuit board having an edge portion with a first connector thereon, said circuit board being supported in a parallel relationship with said side surface for movement in a first direction parallel thereto, said circuit board being supported on and parallel to a subpan member;

a second connector coupled to said first connector,
  said first connector being disconnectable from said second connector by moving said circuit board away from said second connector in said first direction; and
a lever member coupled to said circuit board and said support member and rotatable relative to said support member, in a first rotational direction about an axis transverse to said first direction and parallel to said support member side surface, to forcibly move said circuit board away from said second connector in said first direction in a manner disconnecting said first connector from said second connector, said lever member being pivotally connected to said subpan member; and
a slot formed in said support member and extending parallel to said first direction, and a tab structure formed on said subpan member and slidingly received in said slot to maintain movement of said subpan member parallel to said first direction.

20. The electronic apparatus of claim 19 wherein said electronic apparatus is a computer server.

21. Electronic apparatus comprising:
a support structure;
a first circuit board carried on said support structure and having a first connector;
a second circuit board carried on said support structure perpendicularly to said first circuit board and having a second connector releasably coupled to said first connector,
  said first and second connectors being disconnectable by moving one of said first and second circuit boards away from the other of said first and second circuit boards in a first direction transverse to said first circuit board and parallel to said second circuit board;
a first disconnect structure operative to move said first circuit board away from said second circuit board in said first direction in a manner disconnecting said first connector from said second connector without disturbing said second circuit board; and
a second disconnect structure operative to move said second circuit board away from said first circuit board in said first direction in a manner disconnecting said second connector from said first connector without disturbing said first circuit board.

22. The electronic apparatus of claim 21 wherein said apparatus is a computer server.

23. The electronic apparatus of claim 21 wherein said second disconnect structure is further operative to move said second circuit board toward said first circuit board in said first direction in a manner connecting said second connector to said first connector.

24. The electronic apparatus of claim 21 wherein said support structure includes:
a first wall member upon which said first circuit board is carried in a parallel relationship therewith, and
a second wall member upon which said second circuit board is carried in a parallel relationship therewith, said second wall member being perpendicular to said first wall member.

25. The electronic apparatus of claim 21 wherein said cooperating structures include cooperating cam surfaces on said disconnect member and said support structure.

26. The electronic apparatus of claim 21 wherein said first disconnect structure includes:

a disconnect member interposed between said first circuit board and said support structure and movable relative thereto in a second direction perpendicular to said first direction, and
cooperating structures on said disconnect member and said support structure operative to cause said disconnect member to forcibly move said first circuit board away from said second circuit board in said first direction, in a manner disconnecting said first connector from said second connector, in response to movement of said disconnect member in said second direction relative to said first circuit board and said support structure.

27. The electronic apparatus of claim 26 further comprising a lever handle operative to exert a leveraged force in said second direction on said disconnect member.

28. The electronic apparatus of claim 27 wherein said lever handle has a first portion pivotally connected to said support structure, and a second portion pivotally connected to said disconnect member.

29. The electronic apparatus of claim 21 wherein:
said second circuit board is parallel to a side surface of said support structure, and
said second disconnect structure includes a lever member coupled to said second circuit board and said support structure and rotatable relative to said support structure, in a first rotational direction about an axis transverse to said first direction and parallel to said support structure side surface, to forcibly move said second circuit board away from said first circuit board in said first direction in a manner disconnecting said second connector from said first connector.

30. The electronic apparatus of claim 29 wherein said lever member is rotatable in a second rotational direction, opposite to said first rotational direction, to forcibly move said second circuit board toward said first connector in said first direction in a manner connecting said second connector to said first connector.

31. The electronic apparatus of claim 21 wherein said second circuit board is supported on and parallel to a subpan member, and said lever member is pivotally connected to said subpan member.

32. The electronic apparatus of claim 31 wherein said lever member is pivotally connected to a bracket structure carried on said subpan member.

33. The electronic apparatus of claim 32 wherein:
said lever member is in a first pivoted position when said first and second connectors are coupled, and in a second pivoted position when said first and second connectors are decoupled, and
said lever member has a portion releasably latchable to said bracket structure to releasably retain said lever member in said first pivoted position thereof.

34. The electronic apparatus of claim 31 further comprising a slot formed in said support structure and extending parallel to said first direction, and a tab structure formed on said subpan member and slidingly received in said slot to maintain movement of said subpan member parallel to said first direction.

35. The electronic apparatus of claim 31 wherein:
said support structure has an opening formed therein and disposed between first and second abutment tabs on said support structure, and
said lever member has an end portion extending through said opening and movable into abutment with said first and second tabs in response to rotation of said lever member in opposite directions about said axis.

* * * * *